United States Patent [19]
Murphy

[11] Patent Number: 4,765,471
[45] Date of Patent: Aug. 23, 1988

[54] ELECTRICAL COMPONENT CARRIER

[76] Inventor: Robert Murphy, Powers St., Milford, N.H. 03055

[21] Appl. No.: 118,471

[22] Filed: Nov. 9, 1987

Related U.S. Application Data

[63] Continuation of Ser. No. 037,224, Apr. 10, 1987, abandoned, which is a continuation of Ser. No. 790,353, Oct. 23, 1985, abandoned.

[51] Int. Cl.$^4$ ............................................. B65D 73/02
[52] U.S. Cl. .................................. 206/329; 206/331; 206/489
[58] Field of Search ............... 206/328, 329, 331, 334, 206/489

[56] References Cited

U.S. PATENT DOCUMENTS 3,825,870  7/1974  Damon et al. ...................... 206/328
3,846,740  11/1974 Damon ................................ 206/328
4,099,615  7/1978  Lemke et al. ...................... 206/328

FOREIGN PATENT DOCUMENTS 2105289  3/1983  United Kingdom ................ 206/328

Primary Examiner—Joseph Man-Fu Moy
Attorney, Agent, or Firm—Pearson & Pearson

[57] ABSTRACT

An electrical component carrier comprises a plate assembly. The assembly has a non-conductive plate sandwiched between two conductive plates. The plates of the assembly have holes to receive the pins of the component to be carried, the holes being in registry, and the holes in the non-conductive plate having lesser internal diameters than those in the conductive plates. The plate assembly has side-walls and depending skirts to protect the pins when the component is inserted. The sidewalls have clips which lock the component in place, or a retainer plate may be used which has a pair of lugs which cooperate with the clips to latch the component to the plate assembly. When the component is inserted, the conductive plates protect against electrostatic charge accumulation, and the skirts physically protect the pins as well as electrically isolate them. The pins are also isolated by being held in the holes of the non-conductive plate out of contact with the conductive plates.

15 Claims, 2 Drawing Sheets

ELECTRICAL COMPONENT CARRIER

This application is a continuation of Ser. No. 07/037,224, filed Apr. 10, 1987, now abandoned, which is a continuation of Ser. No. 06/790,353, filed Oct. 23, 1985, now abandoned.

FIELD OF THE INVENTION

The present invention relates to carriers or holders for electrical components such as the chips of integrated circuits or the like.

BACKGROUND OF THE INVENTION

The pins of the components such as integrated circuit chips are usually frangible, and the chips are generally fragile. Accordingly, these chips must be handled with some degree of care. As a rule a certain amount of handling including testing is required before shipment to a customer.

The handling of printed circuit boards also requires a certain degree of care, and sometimes such circuit boards also have frangible pins.

U.S. Pat. No. 3,235,797 to Boscia, et al, Feb. 15, 1966 for "Record Controlled Test Set and Magazine Therefore Having Frangible Finger Incoding Means" describes a magazine for use in testing printed circuits which affords some protection against damage to the pins.

U.S. Pat. No. 3,564,408 to F. G. Schulz, et al, Feb. 16, 1971 for "Test Device for an Electrical Circuit Card" also provides a fixture for receiving a printed circuit card and provides some degree of care for the pins or connectors.

U.S. Pat. No. 3,584,300 to Frank G. Schutz, et al, June 8, 1971 for "Platen-Patch Board Assembly With Spring Biased Electrical Contact Means to Effect Electrical Test on an Electrical Circuit Card" also describes a test apparatus with protected pins for testing printed circuit boards.

U.S. Pat. No. 3,915,850 to Joseph W. Crownover, Oct. 28, 1975, for "Component Handler and Method and Apparatus Utilizing Same" describes a handler for testing capacitive components.

U.S. Pat. No. 4,352,061 to John L. Matrone, Sept. 28, 1982 for "Universal Test Fixture Employing Interchangeable Wired Personalizers" describes probes contained within a platen. The probes move longitudinally between advanced or test positions and retracted positions. Posts advance the probes to test a printed circuit board. This patent also shows a center section sandwiched between two outer sections, but all three sections are of insulative or non-conductive material. Moreover, the smaller diameter registered holes of the center section have only a mechanical purpose in preventing intrusion of pins beyond their desired stroke.

U.S. Pat. No. 4,417,204 to Dehnel, et al, Nov. 22, 1983, for "Printed Circuit Board Tester and Adapter With Memory" describes an adapter for connecting each master printed circuit board to the tester and includes probes to make contact with the various circuit board nodes.

SUMMARY OF THE INVENTION

According to the invention, a carrier for electrical components such as a chip having a generally planar configuration and a plurality of parallel oriented conductive pins depending from the component perpendicularly to the plane of the component comprises a plate assembly and a retainer is sometimes used. The plate assembly has a non-conductive plate sandwiched between two conductive plates. The plates have registered apertures, but the non-conductive plate has lesser transverse dimensioned apertures than those of the conductive apertures. Therefore, when the contact pins of the component are inserted into and through the apertures, the pins are held in position by the non-conductive walls of the apertures of the central plate, and the conductive plates shield the pins and the component. The retainer holds the component in position after insertion. The component may then be tested without removal from the carrier. The conductive plates protect the component from undesirable static charges by dissipating triboelectric charges. Skirts may depend from the plate assembly to protect the pins from inadvertent manual handling and undesirable physical damage.

DESCRIPTION OF THE DRAWINGS

The various objects, advantages, and novel features of the invention will be more fully apparent from the following detailed description when read in connection with the accompanying drawing, in which like reference numerals reier to like parts and in which:

FIG. 1 comprising

DESCRIPTION OF A PREFERRED EMBODIMENT

Figure 1A:
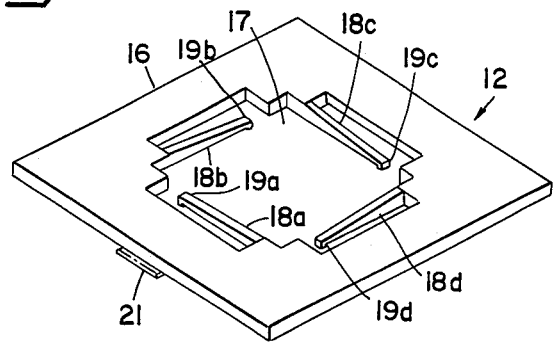
FIGS. 1A, 1B, and 1C are respectively perspective views, somewhat schematic, illustrating in FIGS. 1A and 1C respectively a retainer and plate assembly embodying the invention, and in FIG. 1B a component to be carried in the carrier of FIGS. 1A and 1C.
Figure 1B:
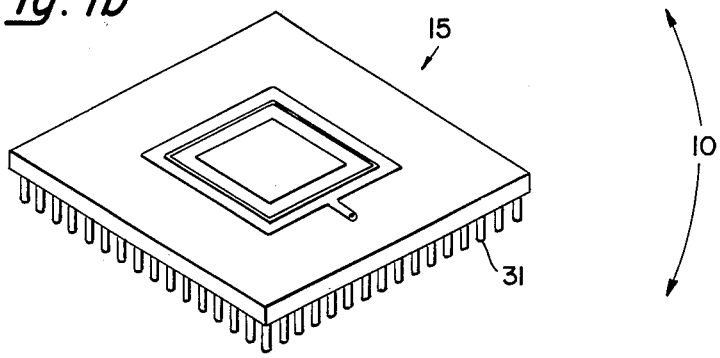
Figure 1C:
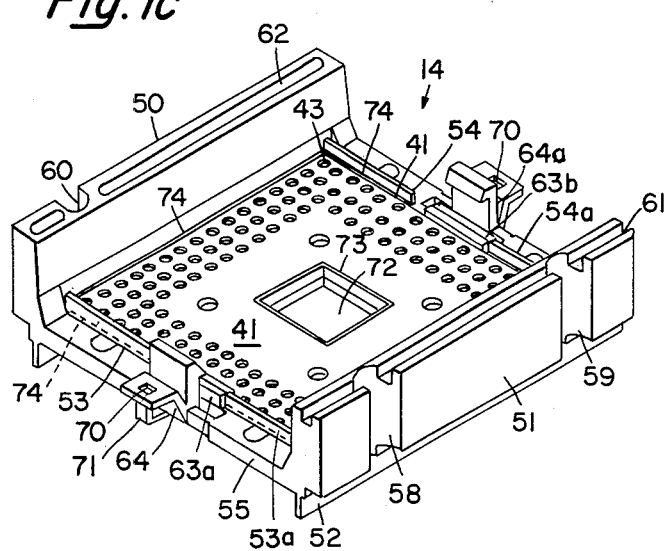
Figure 2:
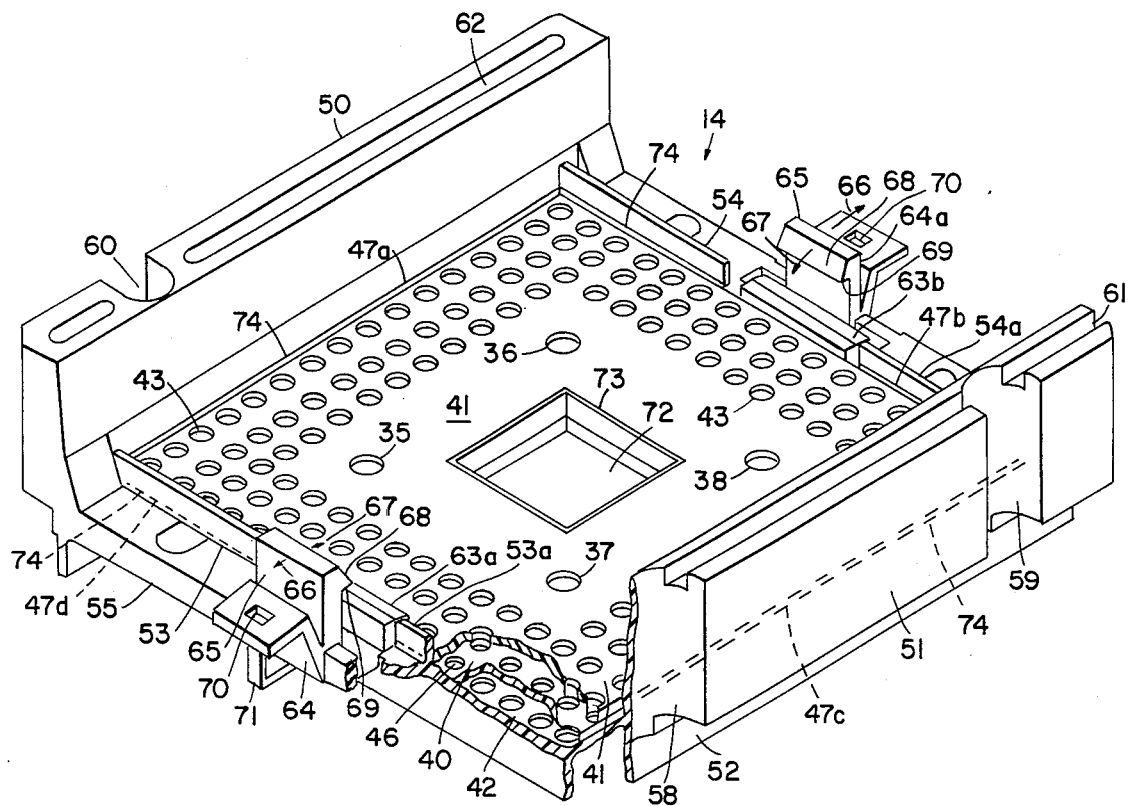
FIG. 2 is an enlarged partially sectioned view of a portion of the plate assembly.
Figure 3:
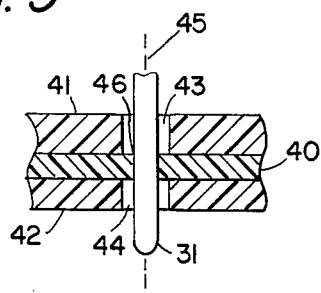
FIG. 3 is a partial sectional view of the plate assembly and a single pin of the component engaged in it.

Referring to the drawing, a carrier 10 is shown comprising a plate assembly 14 and may include a retainer 12. The component 15 is indicated in FIG. 1B between the retainer 12 in FIG. 1A and the plate assembly 14 in FIG. 1C.

The retainer 12 comprises a generally flat cover or body 16 having a central substantially square opening 17 into which four arms 18a, 18b, 18c and 18d are cantilevered from the body of the cover 16 into the opening 17. The arms 18a, 18b, 18c and 18d extend cantilevered inwardly from each internal corner of opening 17 in a clockwise direction slightly slanted inwardly. Each arm 18a, 18b, 18c and 18d carries a downwardly extending head 19a, 19b, 19c and 19d for exerting when in place against the chip, a retaining force. The retainer 12 also has a pair of lugs 21 which extend slightly outward on two opposite sides of the retainer cover, or body 16 and can engage the plate assembly 14 when the retainer is used with the plate assembly.

The component 15 is generally planar and carries a plurality of parallel, conductive contact pins 31 downwardly depending at right angles to the plane of the component.

The plate assembly 14 comprises a non-conductive plate 40 sandwiched between an upper conductive plate 41 and a lower conductive plate 42. The upper and lower plates 41 and 42 respectively which are in registry, that is, with openings on the same center line 45, and also aligned or in registry with the openings or holes 46 in the sandwiched non-conductive plate 40. The plates 40, 41, 42 and the assembled plates are sometimes rectangular, but could be square. Each plate 40, 41, and 42 have flared apertures 35, 36, 37, and 38 which are also in registry or aligned with each other in each plate to receive the base of the swagged pins of the component, so that the body of the component does not contact the upper layer 41.

A pair of opposed sidewalls 50 and 51 contain the chip 15, and extend above the plates 40, 41, and 42, and have a skirt 52 depending below the plates. Lesser sidewalls 53, 53a, 54, and 54a contain the opposing sides of the chip 15, and have depending skirts 55 about as deep as depending skirts 52. The sidewall 51 has a pair of semi-cylindrical, vertically extending guide grooves 58 and 59, as well as a horizontal guide groove 61 on sidewall 51, and guide 62 on opposite sidewall 50. The opposite sidewall 50 has only a single similar guide groove 60 for registration purposes.

Figure 4:
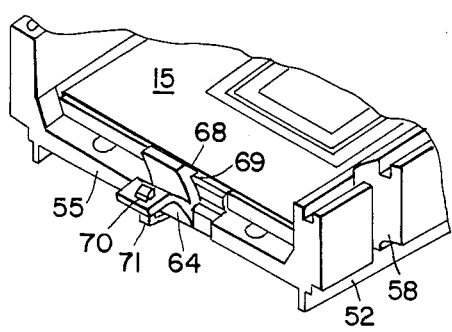
FIG. 4 is a partial perspective view of the clip locked in open position.
Figure 5:
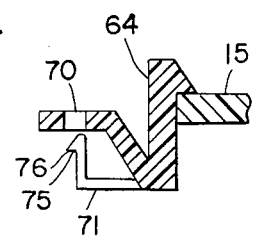
FIG. 5 is a side view of the clip in closed position.

Sidewalls 53, 53a, 54, and 54a, are interrupted centrally as at 63a and 63b, and clips 64, and 64a, are attached at each side in the interruption to the sandwiched plates 40, 41, and 42, in a cantilevered fashion. Each clip 64, and 64a, has an upstanding portion 65, which because of the natural resilience of the material may bend outwardly or inwardly, as indicated respectively by arrows 66 and 67, and tend to return by reason of the restoring force to its natural, equilibrium position shown. Clips 64, and 64a have a bevelled, camming surface 68 and a virtually horizontal lower locking surface 69 which locks the component in place, as shown in FIG. 4. This locking surface may also cooperate with the corresponding lug 21 of the retainer 12 when the retainer is used.

Each clip 64 and 64a has an orifice 70 which locks onto a locking post 71 which has a bevelled camming surface 75, and a horizontal lower locking surface 76 so that each clip may be locked in open position to receive the component 15 on the assembly line or the like. Through the plates 40, 41, and 42, is a central opening 72 illustrated as square. A slightly upstanding rim, or pad 73 on the plate 42 surrounds the opening 72. On the inner edges 47a, 47b, 47c, and 47d, of plate 42, is a slightly upstanding rim or pad 74. When the component 15 is inserted in place and locked in the carrier 10, the component rests on these slightly upstanding rims 73, and 74, so that the component is slightly spaced from the upper plate 41, so that the underside of the component does not contact plate 41. These rims 73 and 74 afford a stable uniform resting surface for the component 15.

To insert a component in the carrier after the clips are locked in open position, the component 15 is appropriately oriented, so that the pins 31 enter the corresponding holes 43 and are carefully inserted to the full depth of the pins. As the side surfaces of the chip are pressed against the retaining clips 64, and 64a, the clips can be closed, so that the camming surfaces 68 are cammed to rotate the clips outwardly in the direction of the arrows 66. If the retainer 12 is applied on top of the component and the lugs are pressed against the retaining clips 64 and 64a, the camming surfaces 68 are also cammed to rotate the clips outwardly in the direction of the arrows. The heads 19a, 19b, 19c, and 19d, are advanced against the top of the chip 15 to urge the chip downward. The arms 18a, 18b, 18c, and 18d, also have resilience, and therefore, press firmly against the chip 15. The clips and the camming surface hold the component in place after insertion is completed by locking surfaces 69 so that the component and retainer are held firmly in place, thereby latching the component 15 in the carrier 10. For removal of the component 15, the two clips 64 and 64a, are rotated outwardly again in the direction of the arrows 66 to unlatch the component 15 or the retainer 12 for withdrawal.

The component 15 may be tested in the carrier 10 while latched in place. A test receptacle having the requisite number of receiving apertures for the pins 31 is guided into place by the guide grooves 58, 59, and 60. The receptacle may be guided for attachment to the carrier in only one orientation, thereby avoiding the possibility of an incorrect orientation for the application of test voltages. The component 15 in the carrier 10 may be handled and transported without danger of the accumulation of electrostatic charges on the carrier. Such charges may damage the component 15, or even cause its destruction for useful purposes. The conductive plates 41 and 42 shield the component 15 from such charges, and from the induction of electrostatic charges that may be injurious to the component 15 by dissipating the charges by conduction. The component pins 31 are firmly held in place by the holes 46 in the non-conductive plate 40 which are smaller than the holes 43 and 44 in conductive plates 41 and 42. The rigidity of the pins 31 is, therefore, buttressed and the ruggedness enhanced. Therefore, the pins are maintained isolated from the conductive plates 41 and 42 and insulated in the carrier 10, except for their contact with the test socket contacts. The surrounding walls 50 and 51 and the skirts 52 and 55, also shield the pins 31 from stray fields and physically from undesirable bending. Thus, the component 15 may be tested while in the carrier and may be shipped in a suitable shipping magazine.

The conductive plates 41 and 42 and the remainder of the carrier, except for the non-conductive plate 40, may be made from polysulphone or polyethersulphone or a glass-filled, carbon loaded nylon, that is, a nylon polysulphone or polyethersulphone in which carbon is dispersed. This material has a high temperature resistance and excellent molding properties for close tolerance control. The internal, non-conductive layer 40 may be a non-conductive, heat stabilized polyether imides. The parts may be ultrasonically welded together. Antistatic topical coatings or migrating fillers employed on the outer surfaces of a carrier are not adequately effective in dissipating charges for protecting a component against the accumulation of electrostatic charges. The conductive material described has a surface resistivity of between $10^2$ and $10^6$ ohms per square, and is also volume conductive. This conductivity according to tests is adequate to dissipate electrostatic charges.

The bending of leads of components, such as the pins 31, is a constant problem. Use of this carrier ameliorates the problem and tends to keep the leads straight during testing and handling while in the carrier described. The carrier also guards against ceramic damage which otherwise often occurs.

The guide grooves 58, 59 and 60 insure not only correct orientation of a test socket, but with matching lugs or pins to insert into the grooves also insures accurate guidance so that the pins 31 of the component are not subjected to bending forces as the test socket is inserted and withdrawn. The insulation of the pins in the apertures or holes 46 of the non-conductive, insulative plate 40 together with the shielding effect of the conductive plates 41 and 42, tends to protect against bridging, leakage and cross-talk or bleeding, because there is no conductivity between pins, and good grounding and dissipation of charges.

The references to up, down, vertical, horizontal and the like, are for convenience of description and do not imply any necessary orientation of the carrier.

I claim:

1. A carrier for components having a generally planar configuration and a plurality of parallel-oriented conductive contact pins depending from the component perpendicularly to the plane of the chip, comprising:

a plate assembly comprising three parallel planar plates, one of which is a non-conductive plate sandwiched between the other two plates which are conductive, the plates having registered apertures, those apertures of the non-conductive plate having lesser transverse dimensions than those of the conductive plates and the plate assembly having at least one vertically upstanding clip at the extreme outside edge of said plate assembly for locking the component to the assembly.

2. A carrier as claimed in claim 1, the plates being outwardly rectangular in shape.

3. A carrier as claimed in claim 2 wherein the plates are square in shape.

4. A carrier as claimed in claim 2, the plates having conductive opposed sidewalls at the sides of the plates, said side walls having depending skirts to shield and protect the pins after the chip is inserted in the carrier.

5. A carrier as claimed in claim 2, the plates having conductive, opposed sidewalls at the sides of the plates, said walls having vertical guide grooves to guide and receive a test socket.

6. A carrier as claimed in claim 4 wherein said walls have horizontal guide grooves for use in registration.

7. A carrier as claimed in claim 1 further comprising:
a retainer for retaining the component against one of the outer plates of the sandwich, so that the pins passing through the registered apertures are held by the walls of the non-conductive apertures spaced and thereby insulated from the walls of the conductive plate apertures.

8. A carrier as claimed in claim 1, the plate assembly having a locking post and the clip having an orifice for receiving the post.

9. A carrier as claimed in claim 7, the plates having conductive, opposed sidewalls at the rectangular sides of the plates, the retainer and the plate assembly having a latch for latching them together with the component between them, the latch comprising a pair of retainer lugs on opposite sides of one of the retainers and the plate assembly, and a pair of cooperating clips on opposite sides of the other of the retainer and the plate assembly.

10. A carrier as claimed in claim 9, the lugs being on the retainer plate, and the clips being on the plate assembly.

11. A carrier as claimed in claim 1, the carrier material, except for that of the non-conductive plate, being a molded, glass-filled, carbon powder loaded nylon.

12. A carrier as claimed in claim 1, the carrier material for that of the non-conductive plate being carbon loaded polysulphone.

13. A carrier as claimed in claim 1 being carbon loaded polyethersulphone.

14. A carrier as claimed in claim 11, the non-conductive plate being made of non-conductive, heat stabilized polyether imides.

15. A carrier as claimed in claim 1, wherein the conductive plate of the plate assembly facing the retainer has upstanding pads to stand off the chip when locked in position.

* * * * *